United States Patent
Uejima

(10) Patent No.: US 10,425,119 B2
(45) Date of Patent: Sep. 24, 2019

(54) HIGH-FREQUENCY SWITCH MODULE

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/668,046

(22) Filed: Aug. 3, 2017

(65) Prior Publication Data

US 2017/0331512 A1 Nov. 16, 2017

Related U.S. Application Data

(63) Continuation of application No. PCT/JP2016/052866, filed on Feb. 1, 2016.

(30) Foreign Application Priority Data

Feb. 5, 2015 (JP) .................... 2015-020844

(51) Int. Cl.
*H04B 1/48* (2006.01)
*H04B 1/00* (2006.01)
(Continued)

(52) U.S. Cl.
CPC .............. *H04B 1/48* (2013.01); *H03H 7/46* (2013.01); *H04B 1/00* (2013.01); *H04B 1/006* (2013.01);
(Continued)

(58) Field of Classification Search
CPC ............. H04B 1/48; G03H 7/46; H03H 7/46
(Continued)

(56) References Cited

U.S. PATENT DOCUMENTS 5,285,177 A 2/1994 Norose
5,748,054 A * 5/1998 Tonegawa .............. H03K 17/76
333/104
(Continued)

FOREIGN PATENT DOCUMENTS

JP H05-235798 A 9/1993
JP 2004-328136 A 11/2004
(Continued)

OTHER PUBLICATIONS

International Search report issued in PCT/JP2016/052866 dated Apr. 19, 2016.
Written Opinion issued in PCT/JP2016/052866 dated Apr. 19, 2016.

*Primary Examiner* — Huan Hoang
*Assistant Examiner* — Muna A Techane
(74) *Attorney, Agent, or Firm* — Pearne & Gordon LLP

(57) ABSTRACT

A high-frequency switch module (10) includes a switch element (20) and LC parallel resonant circuits (31 and 32). The switch element (20) includes selection target terminals (P14 and P21) used to transmit communication signals using different frequencies. The LC parallel resonant circuits (31 and 32) are connected between a connection conductor (901) connected to the selection target terminal (P14) and a connection conductor (902) connected to the selection target terminal (P21). The LC parallel resonant circuits (31 and 32) are connected in series between the connection conductors (901 and 902). The LC parallel resonant circuits (31 and 32) have different attenuation pole frequencies.

11 Claims, 4 Drawing Sheets

(51) Int. Cl.
*H04B 1/50* (2006.01)
*H03H 7/46* (2006.01)
*H04B 1/403* (2015.01)

(52) U.S. Cl.
CPC ......... *H04B 1/0057* (2013.01); *H04B 1/0064* (2013.01); *H04B 1/406* (2013.01); *H04B 1/50* (2013.01)

(58) Field of Classification Search
USPC .................................................. 365/185.19
See application file for complete search history.

(56) References Cited

U.S. PATENT DOCUMENTS

| | | | |
|---|---|---|---|
| 6,694,438 B1* | 2/2004 | Porter | G06F 1/26 363/157 |
| 2002/0137471 A1* | 9/2002 | Satoh | H01P 1/15 455/83 |
| 2009/0052358 A1* | 2/2009 | Uejima | H03H 7/465 370/297 |
| 2016/0373085 A1* | 12/2016 | Barbieri | H01L 23/49822 |
| 2017/0244538 A1* | 8/2017 | Chang | H04B 1/48 |

FOREIGN PATENT DOCUMENTS

| | | | |
|---|---|---|---|
| JP | 2004328136 | * | 11/2004 |
| JP | 2005-260806 A | | 9/2005 |
| JP | 2006-109084 A | | 4/2006 |
| WO | 2014119046 A1 | | 8/2014 |
| WO | WO2014119046 | * | 8/2014 |

\* cited by examiner

HIGH-FREQUENCY SWITCH MODULE

BACKGROUND OF THE DISCLOSURE

This application is a continuation of International Application No. PCT/JP2016/052866 filed on Feb. 1, 2016 which claims priority from Japanese Patent Application No. 2015-020844 filed on Feb. 5, 2015. The contents of these applications are incorporated herein by reference in their entireties.

FIELD OF THE DISCLOSURE

The present disclosure relates to a high-frequency switch module used in, for example, a front-end portion in a radio communication apparatus.

DESCRIPTION OF THE RELATED ART

In current years, along with the diversification of communication bands, radio communication apparatuses such as cellular phones include front-end circuits capable of performing communications in many communication bands. The miniaturization of such a front-end circuit is achieved by using a common antenna to transmit/receive transmission signals and reception signals in a plurality of communication bands. Since an antenna is shared in a plurality of communication bands, a switch module is employed in many cases as disclosed in Patent Document 1.

For example, a switch module disclosed in Patent Document 1 includes transmission/reception circuits for a plurality of communication bands and SPnT (n is an integer greater than or equal to 2) switch elements. A common terminal of the switch elements are connected to an antenna. A plurality of selection target terminals of the switch elements are connected to the respective transmission/reception circuits for the communication bands. With this configuration, one of the transmission/reception circuits for the communication bands is selected and is connected to the antenna.

Patent Document 1: Japanese Unexamined Patent Application Publication No. 2006-109084

BRIEF SUMMARY OF THE DISCLOSURE

In a high-frequency switch module including such switch elements, a high-frequency signal to be input into a certain selection target terminal is sometimes leaked to another selection target terminal and a signal path connected to this selection target terminal. In a case where such a leakage occurs, the transmission characteristics in a communication band at the selection target terminal where the leakage has occurred are deteriorated.

It is an object of the present disclosure to provide a high-frequency switch module capable of suppressing the deterioration in the transmission characteristics of the signals in a plurality of communication bands which are transmitted via switch elements.

A high-frequency switch module according to the present disclosure includes a switch element and a filter circuit. The switch element includes a first selection target terminal and a second selection target terminal which are used to transmit communication signals using different frequencies. The filter circuit is connected between the first selection target terminal and the second selection target terminal and has a plurality of attenuation poles.

By setting the fundamental frequency of a communication signal transmitted via the second selection target terminal and the frequency of a harmonic component of the communication signal as frequencies at the attenuation poles of the filter circuit in this configuration, the high isolation between the first selection target terminal and the second selection target terminal can be ensured at the fundamental frequency of a communication signal transmitted via the second selection target terminal and the frequency of a harmonic component of the communication signal.

It is desired that a high-frequency switch module according to the present disclosure have the following configuration. The switch element includes a first common terminal, a second common terminal, first-common-terminal selection target terminals, one of which is selectively connected to the first common terminal, and second-common-terminal selection target terminals, one of which is selectively connected to the second common terminal. The first selection target terminal is one of the first-common-terminal selection target terminals. The second selection target terminal is one of the second-common-terminal selection target terminals.

In this configuration, the high isolation between transmission paths for communication signals transmitted/received via different antennas can be ensured.

A high-frequency switch module according to the present disclosure may have the following configuration. The first common terminal, the second common terminal, the first-common-terminal selection target terminals, and the second-common-terminal selection target terminals are formed in a single package.

With this configuration, a switch element can be downsized. This leads to the downsizing of a high-frequency switch module. Even in a case where a downsized switch element is used, the high isolation between transmission paths for a plurality of communication signals can be ensured.

In a high-frequency switch module according to the present disclosure, the switch element may select the first selection target terminal and the second selection target terminal at the same time.

This configuration is more useful for a case where carrier aggregation is performed using a high-frequency switch module.

A high-frequency switch module according to the present disclosure may have the following configuration. The filter circuit includes a first parallel resonant circuit in which a first inductor and a first capacitor are connected in parallel and a second parallel resonant circuit in which a second inductor and a second capacitor are connected in parallel. The first parallel resonant circuit and the second parallel resonant circuit are connected in series between the first selection target terminal and the second selection target terminal. The first parallel resonant circuit and the second parallel resonant circuit have different resonant frequencies.

This configuration is an exemplary detailed configuration of a filter circuit. By connecting two LC parallel resonant circuits in series, high isolation can be ensured with a simple configuration.

A high-frequency switch module according to the present disclosure may have the following configuration. A high-frequency switch module includes a switch element, a first filter circuit, and a second filter circuit. The switch element includes a first common terminal, a second common terminal, first-common-terminal selection target terminals, one of which is selectively connected to the first common terminal, and second-common-terminal selection target terminals, one of which is selectively connected to the second common terminal. The first filter circuit is connected between a first selection target terminal that is one of the first-common-terminal selection target terminals and a second selection target terminal that is one of the second-common-terminal selection target terminals. The second filter circuit is connected between a third selection target terminal that is one of the first-common-terminal selection target terminals and the second selection target terminal that is one of the second-common-terminal selection target terminals. A frequency at an attenuation pole of the first filter circuit and a frequency at an attenuation pole of the second filter circuit differ from each other.

With this configuration, the high isolation between the first selection target terminal and the second selection target terminal and the high isolation between the third selection target terminal and the second selection target terminal can be ensured.

According to the present disclosure, it is possible to ensure high isolation between transmission paths through which signals in a plurality of communication bands are transmitted via a switch element. This can suppress the deterioration in the transmission characteristics in the respective communication bands.

DETAILED DESCRIPTION OF THE DISCLOSURE

Figure 1:
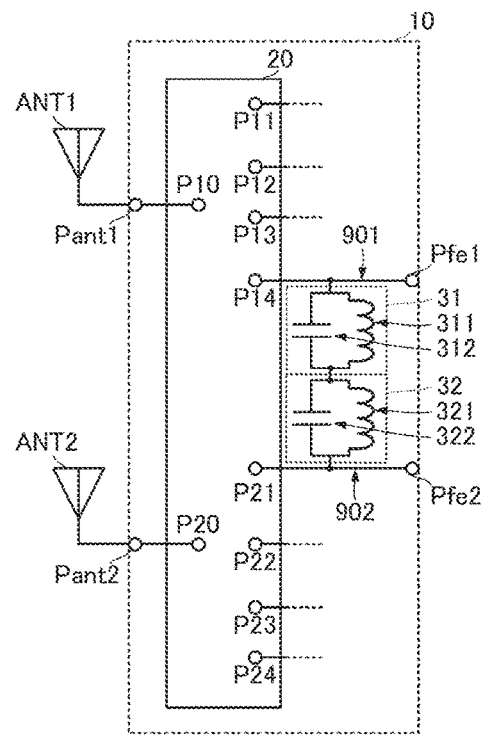
FIG. 1 is a circuit diagram of a high-frequency switch module according to a first embodiment of the present disclosure.

A high-frequency switch module according to a first embodiment of the present disclosure will be described with reference to the accompanying drawings. FIG. 1 is a circuit diagram of a high-frequency switch module according to the first embodiment of the present disclosure.

A high-frequency switch module 10 according to this embodiment includes a switch element 20, and LC parallel resonant circuits 31 and 32. The LC parallel resonant circuit 31 includes an inductor 311 and a capacitor 312 that are connected in parallel. The LC parallel resonant circuit 32 includes an inductor 321 and a capacitor 322 that are connected in parallel.

The high-frequency switch module 10 includes a first antenna connection terminal Pant1, a second antenna connection terminal Pant2, and a plurality of RF terminals. These RF terminals include a first RF terminal Pfe1 and a second RF terminal Pfe2. The first RF terminal Pfe1 corresponds to a first selection target terminal according to the present disclosure. The second RF terminal Pfe2 corresponds to a second selection target terminal according to the present disclosure.

The switch element 20 includes a first common terminal P10, a second common terminal P20, and selection target terminals P11, P12, P13, P14, P21, P22, P23, and P24. The switch element 20 is a DPnT switch that is a semiconductor switch (n is an integer greater than or equal to 4). The first common terminal P10 is selectively connected to one of the selection target terminals P11, P12, P13, and P14. The second common terminal P20 is selectively connected to one of the selection target terminals P21, P22, P23, and P24.

The first common terminal P10 is connected to the first antenna connection terminal Pantl. The first antenna connection terminal Pant1 is connected to an antenna ANT1. The second common terminal P20 is connected to the second antenna connection terminal Pant2. The second antenna connection terminal Pant2 is connected to an antenna ANT2.

The selection target terminal P14 is connected to the first RF terminal Pfe1 via a connection conductor 901. The first RF terminal Pfe1 is connected to various circuit elements including an elastic wave filter such as a SAW filter and an LC filter.

The selection target terminal P21 is connected to the second RF terminal Pfe2 via a connection conductor 902. The second RF terminal Pfe2 is connected to various circuit elements including an elastic wave filter such as a SAW filter, an LC filter, and a PA.

The first RF terminal Pfe1 and the second RF terminal Pfe2 are used to transmit communication signals in different communication bands.

The LC parallel resonant circuits 31 and 32 are connected in series between the connection conductors 901 and 902. The series circuit formed by the LC parallel resonant circuits 31 and 32 corresponds to one of filter circuits according to the present disclosure.

The LC parallel resonant circuits 31 and 32 have different resonant frequencies. That is, frequencies at the attenuation poles of the LC parallel resonant circuits 31 and 32 differ from each other.

For example, in a case where the second RF terminal Pfe2 is an input/output terminal for a BAND17 communication signal and the first RF terminal Pfe1 is an output terminal for a BAND4 reception signal, the resonant frequency of the LC parallel resonant circuit 31 is set at or close to a frequency of a third-order harmonic component of a BAND17 transmission signal. The resonant frequency of the LC parallel resonant circuit 32 is set at or close to the fundamental frequency of a BAND17 transmission signal.

Figure 2:
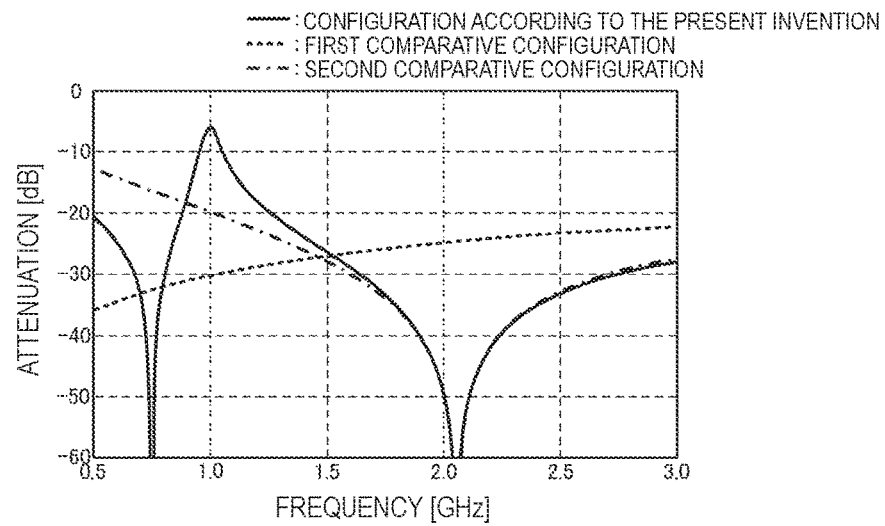
FIG. 2 is a graph indicating the attenuation characteristics of a filter circuit in a high-frequency switch module according to the first embodiment of the present disclosure.

By using the above-described configuration, a filter circuit has the attenuation characteristics illustrated in FIG. 2. FIG. 2 is a graph indicating the attenuation characteristics of a filter circuit in a high-frequency switch module according to the first embodiment of the present disclosure. In FIG. 2, a solid line indicates the characteristics in a configuration according to the present disclosure, a broken line indicates the characteristics in a case where no component is connected between the connection conductors 901 and 902, and a dot-and-dash line indicates the characteristics in a case where a single LC parallel resonant circuit is connected between the connection conductors 901 and 902.

As illustrated in FIG. 2, by using a configuration according to this embodiment, between the first RF terminal Pfe1 and the second RF terminal Pfe2, a large amount of attenuation can be obtained around the fundamental frequency of a BAND17 transmission signal and the frequency of a third-order harmonic component of a BAND17 transmission signal.

Figure 3:
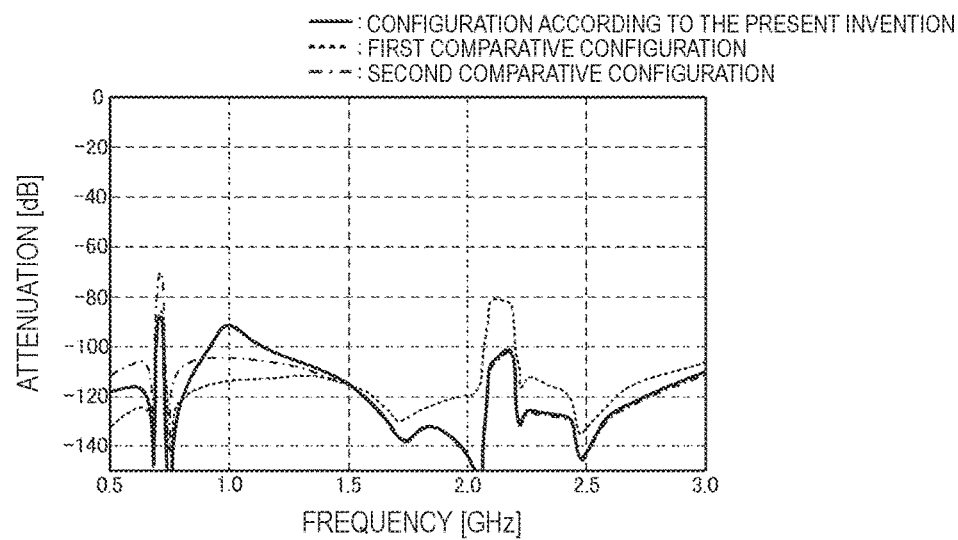
FIG. 3 is a graph indicating the transmission characteristics between a first RF terminal and a second RF terminal in a high-frequency switch module according to the first embodiment of the present disclosure.

FIG. 3 is a graph indicating the transmission characteristics between a first RF terminal and a second RF terminal in a high-frequency switch module according to the first embodiment of the present disclosure. In FIG. 3, a vertical axis represents the amount of attenuation. In FIG. 3, a solid line indicates the characteristics in a configuration according to the present disclosure, a broken line indicates the characteristics in a case where no component is connected between the connection conductors 901 and 902, and a dot-and-dash line indicates the characteristics in a case where a single LC parallel resonant circuit is connected between the connection conductors 901 and 902.

As illustrated in FIG. 3, by using a configuration according to this embodiment, between the first RF terminal Pfe1 and the second RF terminal Pfe2, high isolation can be ensured around the fundamental frequency of a BAND17 transmission signal and the frequency of a third-order harmonic component of a BAND17 transmission signal.

Figure 4:
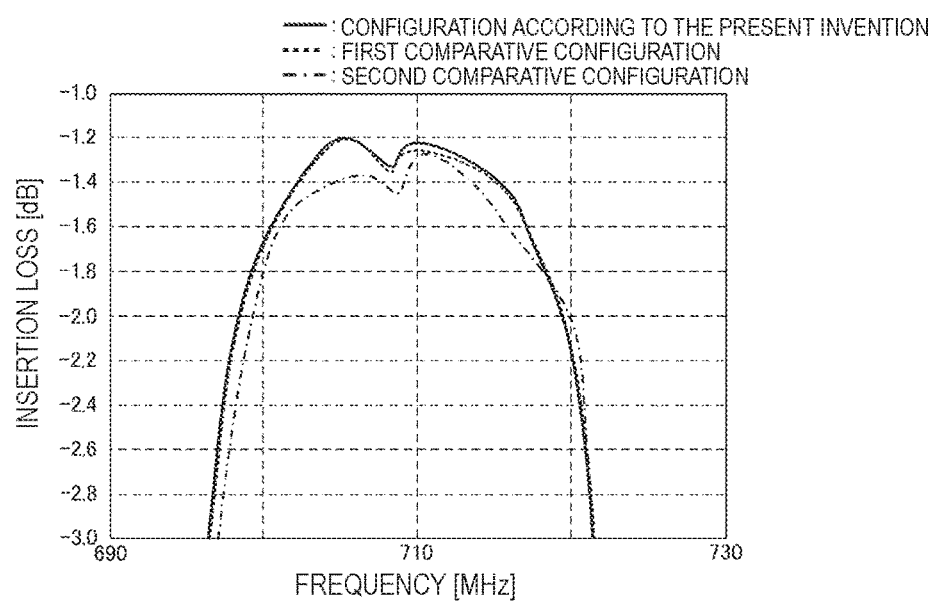
FIG. 4 is a graph indicating the frequency response of an insertion loss of a transmission path using a first RF terminal in a high-frequency switch module according to the first embodiment of the present disclosure.

FIG. 4 is a graph indicating the frequency response of an insertion loss of a transmission path using a first RF terminal in a high-frequency switch module according to the first embodiment of the present disclosure. In FIG. 4, a solid line indicates the characteristics in a configuration according to the present disclosure, a broken line indicates the characteristics in a case where no component is connected between the connection conductors 901 and 902, and a dot-and-dash line indicates the characteristics in a case where a single LC parallel resonant circuit is connected between the connection conductors 901 and 902.

As illustrated in FIG. 4, by using a configuration according to this embodiment, an insertion loss can be reduced in the frequency band of a BAND17 transmission signal that is to be transmitted via the second RF terminal Pfe2 as compared with a case where a comparative configuration is used. A BAND17 transmission signal can therefore be transmitted with low losses.

As described above, by using a configuration according to this embodiment, it is possible to suppress the leakage of harmonic components from a transmission path to another transmission path where the frequency of harmonic components is close to or overlaps with the frequency of the harmonic components at the transmission path and suppress a transmission loss of a fundamental wave that is to be transmitted through the transmission path. It is therefore possible to suppress the deterioration in the transmission characteristics of communication signals in respective communication bands and transmit the communication signals in the respective communication bands with low losses.

Especially in a case where the transmission of a BAND17 transmission signal and the reception of a BAND4 reception signal are performed at the same time in carrier aggregation, a configuration according to this embodiment is more useful. More specifically, by using this configuration, it is possible to ensure the isolation between a transmission path for a BAND17 transmission signal and a transmission path for a BAND4 reception signal and suppress the degradation in BNAD4 reception sensitivity. It is also possible to reduce the transmission loss of a BAND17 transmission signal.

Although a case where BNAD17 transmission and BNAD4 reception are performed has been described in this embodiment, a configuration according to this embodiment can also be employed in a case where the harmonic components of one of communication signals are close to or overlap the fundamental frequency of the other one of the communication signals. In this case, the resonant frequencies of the LC parallel resonant circuits 31 and 32 may be set in accordance with a communication band used for transmission as appropriate.

In the high-frequency switch module 10 according to this embodiment, a single switch is used to select one of transmission paths connected to two antennas by which transmission and reception are performed. Accordingly, a portion for performing a switch function can be downsized in the high-frequency switch module 10 and the high-frequency switch module 10 can be reduced in size as compared a high-frequency switch module 10A according to a second embodiment of the present disclosure to be described below.

Figure 5:
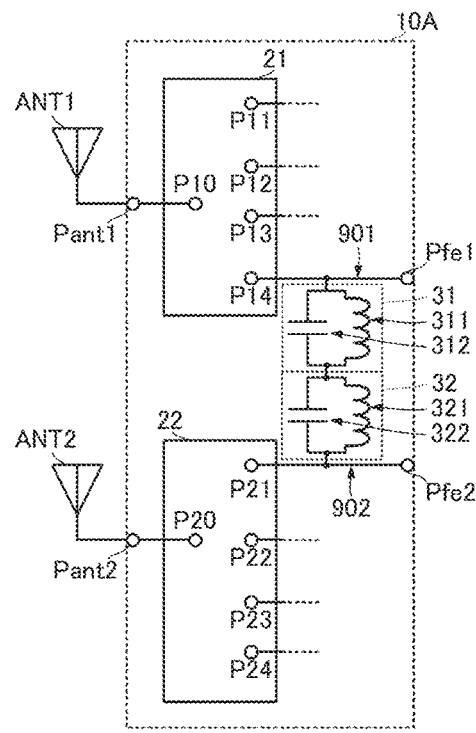
FIG. 5 is a circuit diagram of a high-frequency switch module according to a second embodiment of the present disclosure.

Next, a high-frequency switch module according to the second embodiment of the present disclosure will be described with reference to the accompanying drawing. FIG. 5 is a circuit diagram of a high-frequency switch module according to the second embodiment of the present disclosure.

A high-frequency switch module 10A according to this embodiment differs from the high-frequency switch module 10 according to the first embodiment in that the high-frequency switch module 10A includes switch elements 21 and 22 instead of the switch element 20.

The switch element 21 is an SPnT switch that is a semiconductor switch (n is an integer greater than or equal to 4). The switch element 21 includes the first common terminal P10 and the selection target terminals P11, P12, P13, and P14. The first common terminal P10 is selectively connected to one of the selection target terminals P11, P12, P13, and P14.

The switch element 22 is an SPnT switch that is a semiconductor switch (n is an integer greater than or equal to 4). The switch element 22 includes the second common terminal P20 and the selection target terminals P21, P22, P23, and P24. The second common terminal P20 is selectively connected to one of the selection target terminals P21, P22, P23, and P24.

With this configuration, an operational effect similar to that obtained in the first embodiment can be obtained. In the configuration according to this embodiment, the switch elements 21 and 22 are used to physically separate the transmission paths connected to the antennas ANT1 and ANT2 by which transmission and reception are performed. The electromagnetic coupling between the selection target terminals P14 and P21 can therefore be suppressed. As a result, the transmission paths, between which high isolation should be ensured, can be more highly isolated.

Figure 6:
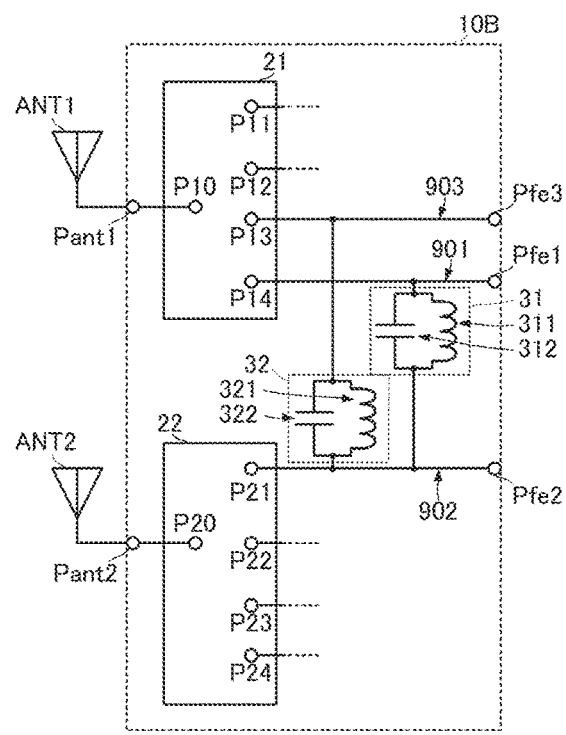
FIG. 6 is a circuit diagram of a high-frequency switch module according to a third embodiment of the present disclosure.

Next, a high-frequency switch module according to a third embodiment of the present disclosure will be described with reference to the accompanying drawing. FIG. 6 is a circuit diagram of a high-frequency switch module according to the third embodiment of the present disclosure.

A high-frequency switch module 10B according to this embodiment includes the switch elements 21 and 22 and the LC parallel resonant circuits 31 and 32. The LC parallel resonant circuit 31 includes the inductor 311 and the capacitor 312 that are connected in parallel. The LC parallel resonant circuit 32 includes the inductor 321 and the capacitor 322 that are connected in parallel.

The high-frequency switch module 10B includes the first antenna connection terminal Pantl, the second antenna connection terminal Pant2, and a plurality of RF terminals. The RF terminals include the first RF terminal Pfe1, the second RF terminal Pfe2, and a third RF terminal Pfe3. The first RF terminal Pfe1 corresponds to a first selection target terminal according to the present disclosure. The second RF terminal Pfe2 corresponds to a second selection target terminal according to the present disclosure. The third RF terminal Pfe3 corresponds to a third selection target terminal according to the present disclosure.

The switch element 21 is an SPnT switch that is a semiconductor switch (n is an integer greater than or equal to 4). The switch element 21 includes the first common terminal P10 and the selection target terminals P11, P12, P13, and P14. The first common terminal P10 is selectively connected to one of the selection target terminals P11, P12, P13, and P14.

The switch element 22 is an SPnT switch that is a semiconductor switch (n is an integer greater than or equal to 4). The switch element 22 includes the second common terminal P20 and the selection target terminals P21, P22, P23, and P24. The second common terminal P20 is selectively connected to one of the selection target terminals P21, P22, P23, and P24.

The first common terminal P10 is connected to the first antenna connection terminal Pantl. The first antenna connection terminal Pantl is connected to the antenna ANT1. The second common terminal P20 is connected to the second antenna connection terminal Pant2. The second antenna connection terminal Pant2 is connected to the antenna ANT2.

The selection target terminal P14 is connected to the first RF terminal Pfe1 via the connection conductor 901. The first RF terminal Pfe1 is connected to various circuit elements including an elastic wave filter such as a SAW filter and an LC filter.

The selection target terminal P21 is connected to the second RF terminal Pfe2 via a connection conductor 902. The second RF terminal Pfe2 is connected to various circuit elements including an elastic wave filter such as a SAW filter, an LC filter, and a PA.

The selection target terminal P13 is connected to the third RF terminal Pfe3 via a connection conductor 903. The third RF terminal Pfe3 is connected to various circuit elements including an elastic wave filter such as a SAW filter and an LC filter.

The first RF terminal Pfe1 and the second RF terminal Pfe2 are used to transmit communication signals in different communication bands. The second RF terminal Pfe2 and the third RF terminal Pfe3 are used to transmit transmission signals and reception signals in the same communication band. More specifically, the second RF terminal Pfe2 is used to transmit transmission signals and the third RF terminal Pfe3 is used to transmit reception signals.

The LC parallel resonant circuit 31 is connected between the connection conductors 901 and 902. The LC parallel resonant circuit 31 corresponds to a first filter circuit according to the present disclosure.

The LC parallel resonant circuit 32 is connected between the connection conductors 902 and 903. The LC parallel resonant circuit 32 corresponds to a second filter circuit according to the present disclosure.

The LC parallel resonant circuits 31 and 32 have different resonant frequencies. That is, frequencies at the attenuation poles of the LC parallel resonant circuits 31 and 32 differ from each other.

For example, in a case where the second RF terminal Pfe2 is an input terminal for a BAND17 transmission signal and the first RF terminal Pfe1 is an output terminal for a BAND4 reception signal, the resonant frequency of the LC parallel resonant circuit 31 is set at or close to a frequency of a third-order harmonic component of a BAND17 transmission signal.

In a case where the second RF terminal Pfe2 is an input terminal for a BAND17 transmission signal and the third RF terminal Pfe3 is an output terminal for a BAND17 reception signal, the resonant frequency of the LC parallel resonant circuit 32 is set so that the fundamental frequency of a reception signal falls within an attenuation band near the fundamental frequency of a BAND17 transmission signal.

By using the above-described configuration, it is possible to suppress the leakage of harmonic components of a BAND17 transmission signal from the second RF terminal Pfe2 to the first RF terminal Pfe1. It is also possible to suppress the leakage of fundamental wave components of a BAND17 transmission signal from the second RF terminal Pfe2 to the third RF terminal Pfe3. The high isolation between the second RF terminal Pfe2 and the first RF terminal Pfe1 can therefore be ensured near the fundamental frequency of a BAND4 reception signal. In addition, the high isolation between the second RF terminal Pfe2 and the third RF terminal Pfe3 can be ensured near the fundamental frequency of a BAND4 reception signal.

Especially in a case where carrier aggregation in which a BAND17 transmission signal and a BAND4 reception signal are transmitted at the same time and carrier aggregation in which a BAND17 transmission signal and a BAN17 reception signal are transmitted at the same time are performed, the high isolation between transmission paths through which respective communication signals are transmitted can be ensured.

Figure 7:
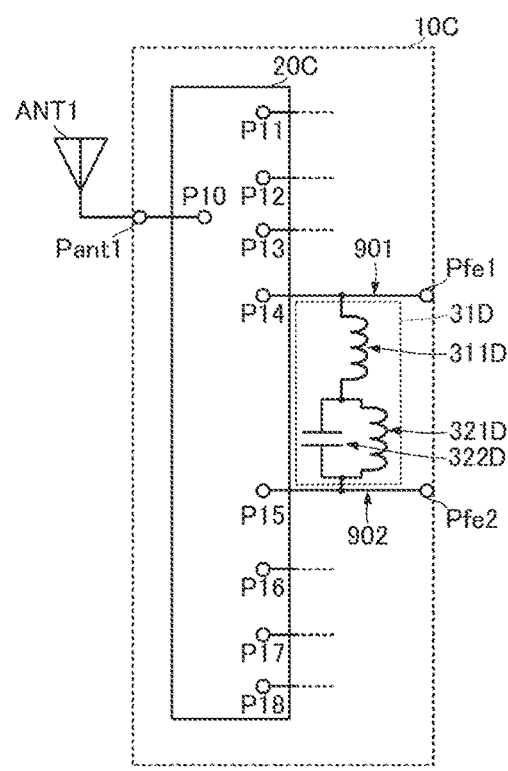
FIG. 7 is a circuit diagram of a high-frequency switch module according to a fourth embodiment of the present disclosure.

Next, a high-frequency switch module according to a fourth embodiment of the present disclosure will be described with reference to the accompanying drawing. FIG. 7 is a circuit diagram of a high-frequency switch module according to the fourth embodiment of the present disclosure.

A high-frequency switch module 10C according to this embodiment differs from the high-frequency switch module 10 according to the first embodiment in that the switch element 20 is replaced by a switch element 20C and the second antenna connection terminal Pant2 is not included. In addition, the configuration of a filter circuit 31D differs from that of the filter circuit in the high-frequency switch module 10 according to the first embodiment.

The switch element 20C is an SPnT switch that is a semiconductor switch (n is an integer greater than or equal to 4). The switch element 20C includes the first common terminal P10, the selection target terminals P11, P12, P13 and P14, and selection target terminals P15, P16, P17, and P18. The first common terminal P10 is selectively connected to one of the selection target terminals P11, P12, P13, P14, P15, P16, P17, and P18.

The selection target terminal P14 is connected to the first RF terminal Pfe1 via the connection conductor 901. The selection target terminal P15 is connected to the second RF terminal Pfe2 via the connection conductor 902.

The filter circuit 31D is connected between the connection conductors 901 and 902. The filter circuit 31D includes inductors 311D and 321D and a capacitor 322D. The inductor 321D and the capacitor 322D are connected in parallel. The inductor 311D is connected in series to a parallel circuit formed by the inductor 321D and the capacitor 322D. The inductor 311 D is connected to the connection conductor 901. The parallel circuit formed by the inductor 321D and the capacitor 322D is connected to the connection conductor 902.

The filter circuit 31D is set so that it has attenuation poles at or close to a frequency of a third-order harmonic component of a transmission signal in a communication band which uses the second RF terminal Pfe2 and at or close to the fundamental frequency of the transmission signal.

By using the above-described configuration, an operational effect similar to that obtained in the first embodiment can be obtained.

10, 10A, 10B, and 10C high-frequency switch module
20, 20C, 21, and 22 switch element
31 and 32 LC parallel resonant circuit
31D filter circuit
311, 321, 311D, and 321D, inductor
312, 322, and 322D capacitor
901, 902, and 903 connection conductor

The invention claimed is:

1. A high-frequency switch module comprising:
a first radio frequency (RF) terminal;
a second RF terminal;
a switch including a first selection target terminal and a second selection target terminal, for transmitting communication signals using different frequencies;
a first conductor connecting the first RF terminal and the first selection target terminal;
a second conductor connecting the second RF terminal and the second selection target terminal; and
a filter circuit connected at a first end to the first conductor and a second end to the second conductor, the filter circuit having a plurality of attenuation poles.

2. The high-frequency switch module according to claim 1,
wherein the switch further includes a first common terminal, a second common terminal, first-common-terminal selection target terminals, one of which is selectively connected to the first common terminal, and second-common-terminal selection target terminals, one of which is selectively connected to the second common terminal,
wherein the first selection target terminal is one of the first-common-terminal selection target terminals, and
wherein the second selection target terminal is one of the second-common-terminal selection target terminals.

3. The high-frequency switch module according to claim 2, wherein the first common terminal, the second common terminal, the first-common-terminal selection target terminals, and the second-common-terminal selection target terminals are provided in a single package.

4. The high-frequency switch module according to claim 2, wherein the switch selects the first selection target terminal and the second selection target terminal at the same time.

5. The high-frequency switch module according to claim 1,
wherein the filter circuit includes a first parallel resonant circuit and a second parallel resonant circuit, wherein in the first parallel resonant circuit, a first inductor and a first capacitor are connected in parallel, and wherein in the second parallel resonant circuit, a second inductor and a second capacitor are connected in parallel,
wherein the first parallel resonant circuit and the second parallel resonant circuit are connected in series between the first selection target terminal and the second selection target terminal, and
wherein the first parallel resonant circuit and the second parallel resonant circuit have different resonant frequencies.

6. The high-frequency switch module according to claim 3, wherein the switch selects the first selection target terminal and the second selection target terminal at the same time.

7. The high-frequency switch module according to claim 2,
wherein the filter circuit includes a first parallel resonant circuit and a second parallel resonant circuit, wherein in the first parallel resonant circuit, a first inductor and a first capacitor are connected in parallel, and wherein in the second parallel resonant circuit, a second inductor and a second capacitor are connected in parallel,
wherein the first parallel resonant circuit and the second parallel resonant circuit are connected in series between the first selection target terminal and the second selection target terminal, and
wherein the first parallel resonant circuit and the second parallel resonant circuit have different resonant frequencies.

8. The high-frequency switch module according to claim 3,
wherein the filter circuit includes a first parallel resonant circuit and a second parallel resonant circuit, wherein in the first parallel resonant circuit, a first inductor and a first capacitor are connected in parallel, and wherein in the second parallel resonant circuit, a second inductor and a second capacitor are connected in parallel,
wherein the first parallel resonant circuit and the second parallel resonant circuit are connected in series between the first selection target terminal and the second selection target terminal, and
wherein the first parallel resonant circuit and the second parallel resonant circuit have different resonant frequencies.

9. The high-frequency switch module according to claim 4,
wherein the filter circuit includes a first parallel resonant circuit and a second parallel resonant circuit, wherein in the first parallel resonant circuit, a first inductor and a first capacitor are connected in parallel, and wherein in the second parallel resonant circuit, a second inductor and a second capacitor are connected in parallel,
wherein the first parallel resonant circuit and the second parallel resonant circuit are connected in series between the first selection target terminal and the second selection target terminal, and
wherein the first parallel resonant circuit and the second parallel resonant circuit have different resonant frequencies.

10. The high-frequency switch module according to claim 1, further comprising:
a third RF terminal;
a third conductor; and
a second filter circuit,
wherein the switch further comprises a third selection target terminal, the third conductor connecting the third selection target terminal to the third RF terminal, and
wherein the second filter circuit is connected at a first end to the third conductor and at a second end to the second conductor.

11. A high-frequency switch module comprising:
a first radio frequency (RF) terminal;
a second RF terminal;
a third RF terminal;

a switch including a first common terminal, a second common terminal, first-common-terminal selection target terminals, one of which is selectively connected to the first common terminal, and second-common-terminal selection target terminals, one of which is selectively connected to the second common terminal;

a first conductor connecting the first RF terminal a first of the first common-terminal selection target terminals;

a second conductor connecting the second RF terminal and a first of the second common-terminal selection target terminals;

a third conductor connecting the third RF terminal and a second of the first common-terminal selection target terminal;

a first filter circuit connected at a first end to the first conductor and at a second end to the second conductor; and a second filter circuit connected at a first end to the third conductor and at a second end to the second conductor, wherein a frequency at an attenuation pole of the first filter circuit and a frequency at an attenuation pole of the second filter circuit differ from each other.

* * * * *